United States Patent
Lim et al.

(10) Patent No.: US 8,542,481 B2
(45) Date of Patent: Sep. 24, 2013

(54) LIQUID CRYSTAL DISPLAY MODULE FOR PORTABLE TERMINAL

(75) Inventors: Sil-Kuy Lim, Hwaseong-si (KR); Dong-Sub Kim, Hwaseong-si (KR); Jae-Seung Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 400 days.

(21) Appl. No.: 13/035,199

(22) Filed: Feb. 25, 2011

(65) Prior Publication Data

US 2011/0216489 A1   Sep. 8, 2011

(30) Foreign Application Priority Data

Mar. 2, 2010 (KR) .................. 10-2010-0018586

(51) Int. Cl.
*G06F 1/16* (2006.01)
*G02F 1/1333* (2006.01)

(52) U.S. Cl.
USPC ............... 361/679.26; 361/679.3; 349/58

(58) Field of Classification Search
USPC ........ 361/679.21, 679.26, 679.3; 349/58–60; 313/582
See application file for complete search history.

(56) References Cited

U.S. PATENT DOCUMENTS

| | | | | |
|---|---|---|---|---|
| 7,050,127 B2* | 5/2006 | Ishiwa | | 349/58 |
| 7,209,195 B2* | 4/2007 | Lin | | 349/58 |
| 7,218,521 B2* | 5/2007 | Kim | | 361/704 |
| 7,237,941 B2* | 7/2007 | Hsieh et al. | | 362/633 |
| 7,292,290 B2* | 11/2007 | Miyagawa et al. | | 349/58 |
| 7,463,490 B2* | 12/2008 | Kim et al. | | 361/752 |
| 8,395,720 B2* | 3/2013 | Lim | | 349/58 |
| 2002/0030996 A1* | 3/2002 | Sakakibara | | 362/330 |
| 2003/0223020 A1* | 12/2003 | Lee | | 349/58 |
| 2005/0047067 A1* | 3/2005 | Bang et al. | | 361/681 |
| 2006/0139271 A1* | 6/2006 | Okuda | | 345/88 |
| 2006/0221268 A1* | 10/2006 | Ko et al. | | 349/58 |
| 2007/0046859 A1* | 3/2007 | Huang et al. | | 349/65 |
| 2007/0109220 A1* | 5/2007 | Jeong | | 345/60 |
| 2007/0139872 A1* | 6/2007 | Lee et al. | | 361/681 |
| 2007/0258199 A1* | 11/2007 | Jeong | | 361/681 |
| 2008/0002093 A1* | 1/2008 | Kim | | 349/58 |
| 2009/0122217 A1* | 5/2009 | Chen et al. | | 349/58 |
| 2010/0309404 A1* | 12/2010 | Lim | | 349/58 |

* cited by examiner

*Primary Examiner* — Adrian S Wilson
(74) *Attorney, Agent, or Firm* — Jefferson IP Law, LLP

(57) ABSTRACT

A Liquid Crystal Display (LCD) module for use in a portable terminal is provided. The LCD module includes a reinforcement plate of a metal material having a bottom surface, and a side surface bent and extended at a substantially constant height along an edge from the bottom surface, a backlight unit laminated onto an upper part of the reinforcement plate, and having a frame of a synthetic resin material that is formed along an edge to insert-mold the reinforcement plate, and an LCD panel fixed by a double sided tape at an upper part of the backlight unit. A portion of the side surface of the reinforcement plate is sequentially twice bent back onto itself on the outside of the reinforcement plate such that its end has a substantially constant width in contact with the bottom surface of the reinforcement plate.

18 Claims, 3 Drawing Sheets

LIQUID CRYSTAL DISPLAY MODULE FOR PORTABLE TERMINAL

PRIORITY

This application claims the benefit under 35 U.S.C. §119(a) of a Korean patent application filed in the Korean Intellectual Property Office on Mar. 2, 2010 and assigned Serial No. 10-2010-0018586, the entire disclosure of which is hereby incorporated by reference.

BACKGROUND OF THE INVENTION

1. Field of the Invention

The present invention relates to a Liquid Crystal Display (LCD) module for a portable terminal. More particularly, the present invention relates to an LCD module for a portable terminal that includes an improved assembly structure that helps prevent a white spot and crack phenomenon caused by an external impact.

2. Description of the Related Art

Various types of electronic communication devices include a display device with a Liquid Crystal Display (LCD) module for displaying information. An example of an electronic communication device that includes a display device is a portable terminal Over time the portable terminal has become lighter, slimmer, and smaller while its functions have become increasingly diversified. Also, portable terminals having various constructions have entered the market that conform to a diversity of desires of various consumers.

Many of the aforementioned diverse functions are based on the LCD module. The current trend for the portable terminal is a portable terminal that while thin, is relatively wide so as to improve the visibility of the LCD module. Accordingly, improvement in the assembly of the constituent elements of the LCD module is important to terminal manufacturers.

In recent years, the use of a high-pixel density Thin Film Transistor (TFT) LCD module has become popular because it conforms to various consumers' desire for a high-fidelity display device. The TFT LCD module is relatively thin. Accordingly, a reinforcement plate of Steel Use Stainless (SUS) material is disposed at a rear surface of the TFT LCD module to help prevent breakage of the TFT LCD module.

The TFT LCD module is constructed by laminating a backlight onto an upper part of a metal plate and attaching an LCD panel to an upper part of the backlight. At this time, a frame of synthetic resin material is formed at an edge of the backlight, and is fixed through a process of insert-molding with the reinforcement plate.

Accordingly, the reinforcement plate has a bottom surface and a side surface that is bent to have three edges, and is fixed by insert-molding the frame to the side surface. A plurality of molding holes are provided in the bottom surface of the reinforcement plate such that the frame is partially introduced into the molding holes and retained thereby.

On the other hand, since the TFT LCD module is relatively thin, the backlight may be damaged due to an external impact. Because of this, a crack or white spot phenomenon may occur on an LCD screen. To prevent this white spot and crack phenomenon, the related art reinforces a bottom part of a terminal with a separate buffer tape of above 0.2 t.

However, because construction of the LCD module using the reinforcement tape employs separate materials, an assembly time of a portable wireless terminal increases. Also, the thickness of a tape adds to the thickness of the portable wireless terminal, thereby preventing the portable wireless terminal from being as thin as it could be.

SUMMARY OF THE INVENTION

An aspect of the present invention is to address at least the above problems and/or disadvantages and to provide at least the advantages described below. Accordingly, an aspect of the present invention is to provide a Liquid Crystal Display (LCD) module of a portable terminal that contributes to the slimming of the portable terminal.

Another aspect of the present invention is to provide an LCD module for a portable terminal that is constructed without a separate buffer tape and that helps prevent damage to an LCD panel due an external impact.

A further aspect of the present invention is to provide an LCD module for a portable terminal that excludes a buffer plate and performs a buffer function with only its own structure.

The above aspects are addressed by an LCD module for a portable terminal.

In accordance with an aspect of the present invention, an LCD module for use in a portable terminal is provided. The LCD module includes a reinforcement plate of a metal material having a bottom surface, and a side surface bent and extended at a substantially constant height along an edge from the bottom surface, a backlight unit laminated onto an upper part of the reinforcement plate, and having a frame of a synthetic resin material that is formed along an edge to insert-mold the reinforcement plate, and an LCD panel fixed by a double sided tape at an upper part of the backlight unit. A portion of the side surface of the reinforcement plate is sequentially twice bent back onto itself on the outside of the reinforcement plate such that its end has a substantially constant width in contact with the bottom surface of the reinforcement plate.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features, and advantages of the present invention will become more apparent from the following detailed description when taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

In the present disclosure, a portable terminal is described as an example. However, the present invention is not limited thereto and is equally applicable to any electronic devices utilizing a Liquid Crystal Display (LCD) panel.

Figure 1:
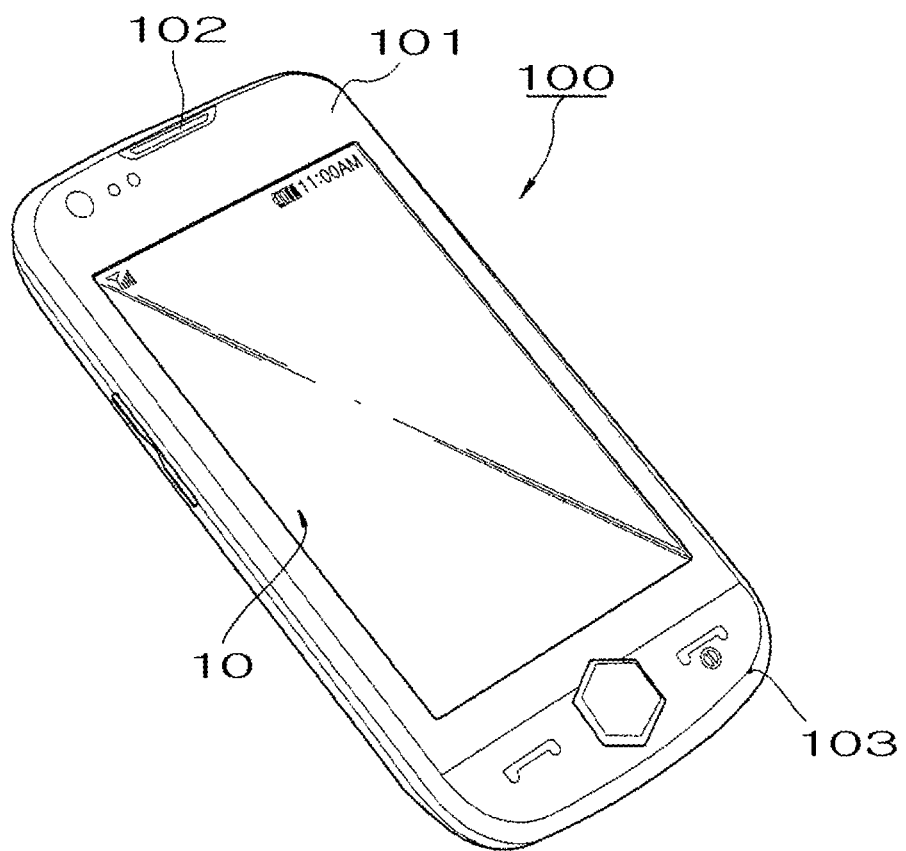
FIG. 1 is a perspective diagram illustrating a portable terminal including a Liquid Crystal Display (LCD) module according to an exemplary embodiment of the present invention.

FIG. 1 is a perspective diagram illustrating a portable terminal including an LCD module according to an exemplary embodiment of the present invention.

Referring to FIG. 1, a bar type portable terminal is illustrated as an example. A display device, i.e., an LCD module 10 is installed within a housing of the bar type portable terminal 100 at a front surface 101 thereof. A speaker unit 102 is installed at an upper part of the front surface 101 of the bar type portable terminal 100. Also, a microphone unit 103 is installed at a lower part of the front surface 101 of the bar type portable terminal 100.

If the LCD module apparatus 10 according to an exemplary embodiment of the present invention is utilized, the potable terminal may be thinner than if an LCD module of the related art is used. Also, the portable terminal may have greater durability against an external impact.

Figure 2:
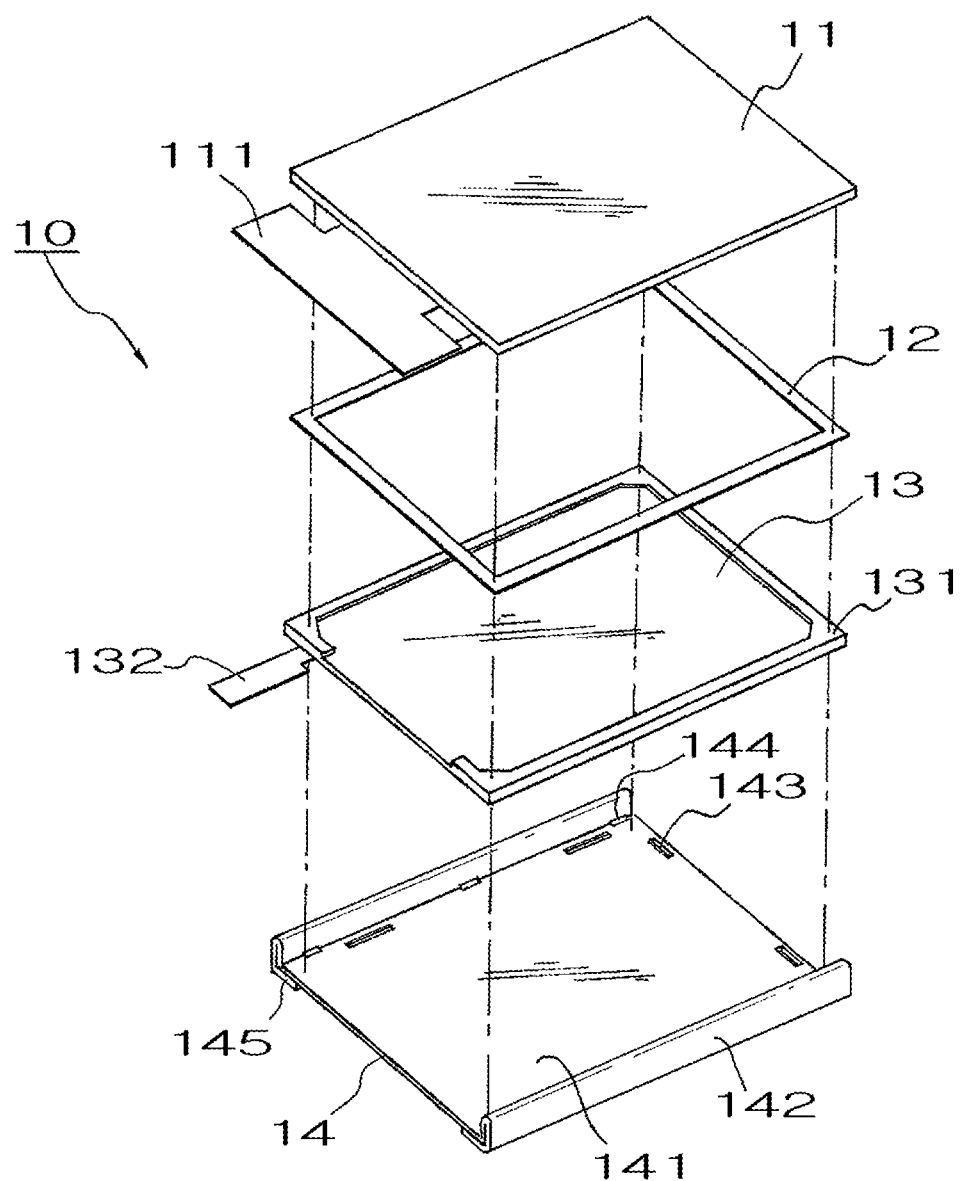
FIG. 2 is a perspective diagram illustrating an LCD module according to an exemplary embodiment of the present invention.

FIG. 2 is a perspective diagram illustrating an LCD module according to an exemplary embodiment of the present invention. The LCD module includes a reinforcement plate 14 of a metal material, and a backlight unit 13, a double-sided tape 12, and an LCD panel 11 that are successively laminated onto the reinforcement plate 14.

The reinforcement plate 14 can be formed of a metal material, e.g., a Steel Use Stainless (SUS) material. The reinforcement plate 14 has a bottom surface 141, and a side surface 142 that is perpendicularly bent upward at a substantially constant height along an edge from the bottom surface 141. The side surface 142 supports a frame 131 of a synthetic resin material supporting the backlight unit 13, and prevents the release of the frame 131 after insert molding.

Also, a plurality of molding holes 143 and 144 are provided at a substantially constant interval in the bottom surface 141 of the reinforcement plate 14. Upon insert molding, the frame 131 of the synthetic resin material is partially introduced into the respective molding holes 143 and 144, which firmly couple the backlight unit 13 to the reinforcement plate 14.

Also, the reinforcement plate 14 is formed of the SUS material. By performing a hemming process of bending the side surface 142 outside and again bending in the bottom surface direction, the bottom surface of the reinforcement plate 14 has a space with a substantially constant height when installed in a housing of the portable terminal. This height helps provide protection from an external impact. Desirably, an end bent outside of the side surface 142 of the reinforcement plate 14 may be disposed from and edge of the bottom surface and up to an area that corresponds to an active area of the LCD panel 11. In other words, it is desirable that the bent area 145 not be superposed onto an active area of the LCD module 11.

Also, while it is shown in the drawings that both side surfaces of the length direction of the reinforcement plate 14 are bent through the hemming process, the present invention is not limited thereto. For example, in an LCD module structure, if four edges are all formed, all of the four edges may be partially bent and processed using the hemming process.

Additionally, Flexible Printed Circuit Boards (FPCBs) 111 and 132 are each drawn out from the LCD panel 11 and the backlight unit 13, and are electrically connected to a Printed Circuit Board (PCB) (not shown) of the portable terminal for operation.

Figure 3:
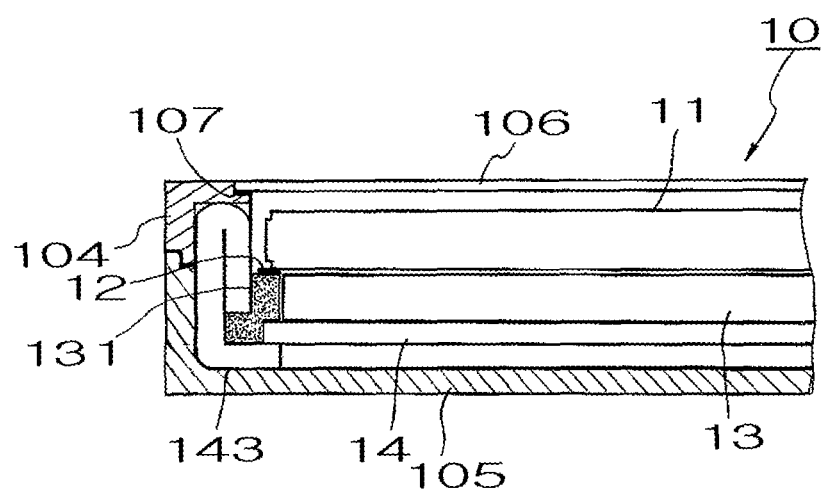
FIG. 3 is a key-part sectional diagram illustrating a state in which an LCD module is assembled according to an exemplary embodiment of the present invention is assembled.

FIG. 3 is a key-part sectional diagram illustrating a state in which an LCD module is assembled according to an exemplary embodiment of the present invention.

Referring to FIG. 3, the backlight unit 13 is fixed to the reinforcement plate 14. The frame 131 of synthetic resin material formed along the edge of the backlight unit 13 is insert-molded into the molding holes 143 and 144 of FIG. 2. The LCD panel 11 is fixed by the double-sided tape 12 to an upper part of the backlight unit 13 that is insert-molded into the reinforcement plate 14.

The aforementioned LCD module 10 is mounted within upper and lower housings 104 and 105 of the terminal and also, a transparent LCD window 106 is installed by the double sided tape 107 in a portion overlapping the LCD panel 11, thereby protecting the LCD panel 11 from an external force.

A bent part 145 of the reinforcement plate 14 according to an exemplary embodiment of the present invention is in contact on a surface of the lower housing 105. However, as described above, since the bent part 145 is bent by as much as a width not actually superposed onto the LCD panel 11, the LCD panel 11 and the backlight unit 13 form a space with the lower housing 105 by as much as a thickness of the bent part 145 of the reinforcement plate 14. This space acts as buffer that helps protect from an external force.

An LCD module according to an exemplary embodiment of the present invention provides a buffer space while only using its own reinforcement plate structure without a separate buffer tape. Accordingly, an assembly time decreases and a potable terminal may be made thinner.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A Liquid Crystal Display (LCD) module for use in a portable terminal, the LCD module comprising:
   a reinforcement plate of a metal material having a bottom surface, and a side surface bent and extended at a substantially constant height along an edge from the bottom surface;
   a backlight unit laminated onto an upper part of the reinforcement plate, and having a frame of a synthetic resin material that is formed along an edge to insert-mold the reinforcement plate; and
   an LCD panel fixed by a double-sided tape at an upper part of the backlight unit,
   wherein a portion of the side surface of the reinforcement plate is sequentially twice bent back onto itself on the outside of the reinforcement plate such that its end has a substantially constant width in contact with the bottom surface of the reinforcement plate.

2. The LCD module of claim 1, wherein the side surface of the reinforcement plate is formed through a hemming process.

3. The LCD module of claim 1, wherein the substantially constant width of the bent part of the side surface in contact with the bottom surface of the reinforcement plate does not overlap an active area of the LCD panel.

4. The LCD module of claim 3, wherein the reinforcement plate is mounted in a housing of the portable terminal, and the active area of the LCD panel and backlight unit has a buffer space having a height corresponding to a thickness of the bent side surface.

5. The LCD module of claim 1, wherein the metal material comprises a Steel Use Stainless (SUS) material.

6. The LCD module of claim 1, wherein the reinforcement plate includes molding holes into which the frame of the synthetic resin material of the backlight unit is insert-molded.

7. A portable terminal including a Liquid Crystal Display (LCD) module, the LCD module comprising:
   a reinforcement plate of a metal material having a bottom surface, and a side surface bent and extended at a substantially constant height along an edge from the bottom surface;
   a backlight unit laminated onto an upper part of the reinforcement plate, and having a frame of a synthetic resin material that is formed along an edge to insert-mold the reinforcement plate; and
   an LCD panel fixed by a double-sided tape at an upper part of the backlight unit,
   wherein a portion of the side surface of the reinforcement plate is sequentially twice bent back onto itself on the outside of the reinforcement plate such that its end has a substantially constant width in contact with the bottom surface of the reinforcement plate.

8. The LCD module of claim 7, wherein the side surface of the reinforcement plate is formed through a hemming process.

9. The LCD module of claim 7, wherein the substantially constant width of the bent part of the side surface in contact with the bottom surface of the reinforcement plate does not overlap with an active area of the LCD panel.

10. The LCD module of claim 9, wherein the reinforcement plate is mounted in a housing of the portable terminal, and the active area of the LCD panel and backlight unit has a buffer space having a height corresponding to a thickness of the bent side surface.

11. The LCD module of claim 7, wherein the metal material comprises a Steel Use Stainless (SUS) material.

12. The LCD module of claim 7, wherein the reinforcement plate includes molding holes into which the frame of the synthetic resin material of the backlight unit is insert-molded.

13. An electronic device including a Liquid Crystal Display (LCD) module, the LCD module comprising:
   a reinforcement plate of a metal material having a bottom surface, and a side surface bent and extended at a substantially constant height along an edge from the bottom surface;
   a backlight unit laminated onto an upper part of the reinforcement plate, and having a frame of a synthetic resin material that is formed along an edge to insert-mold the reinforcement plate; and
   an LCD panel fixed by a double-sided tape at an upper part of the backlight unit,
   wherein a portion of the side surface of the reinforcement plate is sequentially twice bent back onto itself on the outside of the reinforcement plate such that its end has a substantially constant width in contact with the bottom surface of the reinforcement plate.

14. The LCD module of claim 13, wherein the side surface of the reinforcement plate is formed through a hemming process.

15. The LCD module of claim 13, wherein the substantially constant width of the bent part of the side surface in contact with the bottom surface of the reinforcement plate does not overlap with an active area of the LCD panel.

16. The LCD module of claim 15, wherein the reinforcement plate is mounted in a housing of the electronic device, and the active area of the LCD panel and backlight unit has a buffer space having a height corresponding to a thickness of the bent side surface.

17. The LCD module of claim 13, wherein the metal material comprises a Steel Use Stainless (SUS) material.

18. The LCD module of claim 13, wherein the reinforcement plate includes molding holes into which the frame of the synthetic resin material of the backlight unit is insert-molded.

* * * * *